United States Patent [19]

Rumbolt et al.

[11] Patent Number: 4,841,368
[45] Date of Patent: Jun. 20, 1989

[54] TELEVISION CUSTOMER CONTROL FUNCTIONS RESTORER

[75] Inventors: Robin B. Rumbolt; William F. Guerinot; Daniel J. Dargis, all of Knoxville, Tenn.

[73] Assignee: North American Philips Corporation, New York, N.Y.

[21] Appl. No.: 146,528

[22] Filed: Jan. 21, 1988

[51] Int. Cl.⁴ .............................................. H04N 5/44
[52] U.S. Cl. ............................ 358/194.1; 340/825.69; 340/825.72; 455/603; 455/352
[58] Field of Search .................... 358/194.1; 455/603, 455/352; 340/825.69, 825.72

[56] References Cited

U.S. PATENT DOCUMENTS

| 4,322,855 | 3/1982 | Mogi et al. | 358/194.1 X |
| 4,334,242 | 6/1982 | Mangold | 358/194.1 X |
| 4,337,480 | 6/1982 | Bourassin et al. | 358/194.1 X |
| 4,386,436 | 5/1983 | Kocher et al. | 358/194.1 X |
| 4,392,022 | 7/1983 | Carlson | 358/194.1 X |
| 4,488,179 | 12/1984 | Krüger et al. | 358/194.1 X |
| 4,596,049 | 6/1986 | Rizzoti, III | 340/825.72 X |
| 4,626,848 | 12/1986 | Ehlers | 358/194.1 X |
| 4,703,359 | 10/1987 | Rumbolt et al. | 358/194.1 |
| 4,718,112 | 1/1988 | Shinoda | 358/194.1 X |
| 4,771,283 | 9/1988 | Imoto | 358/194.1 X |
| 4,774,511 | 9/1988 | Rumbolt et al. | 358/194.1 X |

FOREIGN PATENT DOCUMENTS

| 54-100222 | 8/1979 | Japan | 358/194.1 |
| 54-100223 | 8/1979 | Japan | 358/194.1 |

Primary Examiner—James J. Groody
Assistant Examiner—E. Anne Faris
Attorney, Agent, or Firm—Edward W. Goodman

[57] ABSTRACT

A remote control transmitter, preferably a universal or reconfigurable remote control transmitter, is incorporated into a television receiver. Mounting a light emitting source such as a light emitting diode in a line of sight or a wired connection with an external tuning system such as that of a VCR or cable converter, and modification of the television tuning system to cause the transmission of activating signals to the remote control transmitter, allows functions which are channel associated and which are therefore generally suppressed when a remote tuning system is used to remain in force.

7 Claims, 4 Drawing Sheets

TELEVISION CUSTOMER CONTROL FUNCTIONS RESTORER

CROSS REFERENCE TO RELATED APPLICATIONS OR PUBLICATIONS

U.S. Pat. No. 4,703,359; and

U.S. Ser. No. 739,357 filed May 30, 1985 and assigned to the same assignee. Both of the above are incorporated by reference into the present application to constitute a part thereof.

BACKGROUND OF THE INVENTION

1. Field of the Invention

The present invention relates to a system for restoring control features of a television receiver normally lost when an external tuning device, such as a cable converter, is used in conjunction with the receiver. Normally, the television receiver is then tuned to an empty channel, while the external tuning device receives the incoming signal, converts its carrier to the empty channel carrier and transmits this signal to the television receiver. Since the television receiver is permanently tuned to the empty channel, channel associated features such as parental control, on screen display of the channel being received, etc. are rendered inactive.

2. Background

U.S Pat. No. 4,386,436 describes a system in which a portion of the receiver system is used to control an external appliance through the AC power supply line. The user enters an appliance control command into the keyboard. The appliance control command is encoded and modulated onto a carrier signal which is transmitted on the AC power supply line. The AC power supply to the external appliance is controlled by an external appliance control module located near the appliance and responsive to the control command from the television receiver.

U.S. Pat. No. 4,529,980 a receiver-transmitter arrangement for controlling, for example, a garage door opening can send a code generated in the receiver to the transmitter by means of a light emitting diode.

Neither of these patents relate to restoring the channel associated functions in a television tuning system while an external tuning device is in use.

SUMMARY OF THE INVENTION

It is an object of the present invention to restore the auxiliary functions previously lost when the television receiver is used in conjunction with an external tuning system. Such channel-associated functions include, but are not limited to, parental control or on-screen channel display.

Control functions for any other remotely-controllable device such as a VCR can also be initiated via the television receiver in accordance with the present invention.

In accordance with the present invention, a television receiver has a remote control transmitter incorporated therein. The remote control transmitter is connected to the tuning system. When the tuning system receives signals externally applied by the user, it responds by generating activating signals for the remote control transmitter. The remote control transmitter in turn translates these activating signals into control signals for an externally controllable device. In particular, the remote control transmitter applies the signals for the externally controllable device to a light emitting source such as a light emitting diode. The light emitting diode is either mounted in a line of sight relationship to the receiving apparatus in the controllable device, or else a wired connection is made. Preferably, the signals are infrared signals.

In a particular preferred embodiment, the system operates as a function restorer which restores channel associated functions normally automatically executed when a television tuning system is tuned to a selected channel. These automatically executed functions are suppressed when the television tuning system is tuned to an available channel different from the selected channel for operation in conjunction with external tuning means. In accordance with the invention, the user first generates an external tuner selection signal signifying desired operation with the external tuning device. The user then generates a first selected channel signal which signifies the channel he wishes to receive. In the receiver are means responsive to the external tuner selection signal and the first selected channel signal which tune the tuning means to an available channel rather than the selected channel, but execute the channel associated function. In addition, there are remote control transmitter means in the television receiver which are connected to the television tuning system. The remote control transmitter means generate a second selected channel signal corresponding to the first selected channel signal. The second selected channel signal is then transmitted to the external tuning means for tuning the external tuning means to the selected channel.

In the preferred embodiment, the remote control transmitter is a universal remote control transmitter which is capable of controlling different types of devices, such as, for example, VCRs and cable converters. Particularly desirable is a remote control transmitter capable of controlling different types of devices also of different manufacturers.

The operation and the objectives of the present invention will become clearer in the following description of the preferred embodiments, particularly when considered in association with the drawing.

DESCRIPTION OF THE PREFERRED EMBODIMENTS

Figure 1:
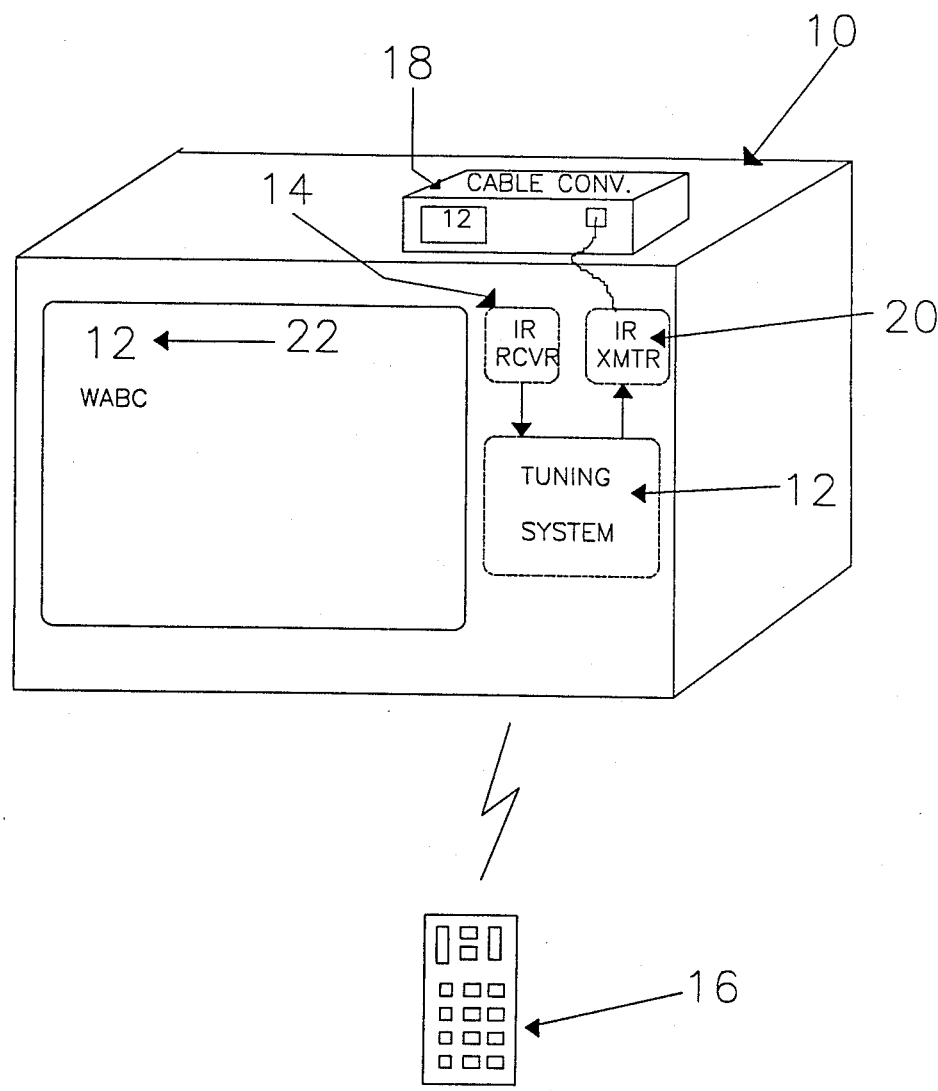
FIG. 1 is a pictorial representation of a television receiver and cable converter incorporating the present invention.

In FIG. 1, a television receiver 10 includes a tuning system 12 which, in the absence of the present invention operates under control of an IR receiver 14. Receiver 14 responds to infrared (IR) command signals generated by a hand-held remote control transmitter 16.

Normally, when a cable converter 18 is used in conjunction with receiver 10, receiver 10 would be permanently tuned to an empty channel, such as channel 3, while the tuning function would be taken over by the cable converter, again under control of a remote control transmitter. When the remote control transmitter is a universal transmitter such as described in U.S. application Ser. No. 739,357, filed May 30, 1985 or U.S. Pat. No. 4,703,359, or any other universal or reconfigurable remote transmitter, the cable converter and the television receiver can be controlled by the user with the same remote transmitter.

When the cable converter is in use, the television receiver is permanently tuned to an empty channel, while the cable converter is tuned to the desired incoming channel. The incoming signal is converted in the cable converter to a carrier suitable for receipt by the television receiver on the empty channel to which the television receiver tuning system is tuned.

Many television receivers now in use have channel associated features. For example, parental control systems are available which do not allow viewing of a given channel unless a particular code word is entered into the system. Also, some television receivers allow on-screen display of the channel to which the receiver is tuned as shown in FIG. 1 by the channel designation indicated by reference number 22. Other channel associated features exist in present television sets and further development of such functions is expected. All of these are lost for conventional television receivers in which the tuning system is essentially bypassed by an external tuning system such as that of a VCR or a cable converter.

According to the present invention, to restore channel-associated functions to a television receiver, a universal remote control transmitter capable of operating cable converters and/or other external devices of different manufacturers, indicated by reference numeral 20 in FIG. 1, is built into the television receiver and interfaced to the tuning system. This remote control transmitter may be one disclosed in one of the cross-referenced patent application or patent, which are hereby incorporated by reference into the present application. As mentioned above, this type of remote control transmitter can operate any number of external devices of different types and different manufacturers. The appropriate control signals for a type of equipment, manufacturer, and desired command are selected under external control from values stored in memory in the transmitter. The exact operation of such units is not a subject of the present invention. It suffices to say that units exist by which remotely controlled devices from different manufacturers can be controlled by one and the same unit. This is the type of unit referred to herein as a universal remote control transmitter. Such a universal remote control transmitter is designated by reference numeral 20 in FIG. 1. Of course if the present invention is to be used in an integrated system furnished by a given manufacturer, a remote control transmitter controlling only that manufacturer's device can be substituted for the universal remote control transmitter. Also, instead of a universal remote control transmitter, a reconfigurable one may be used.

Figure 2:
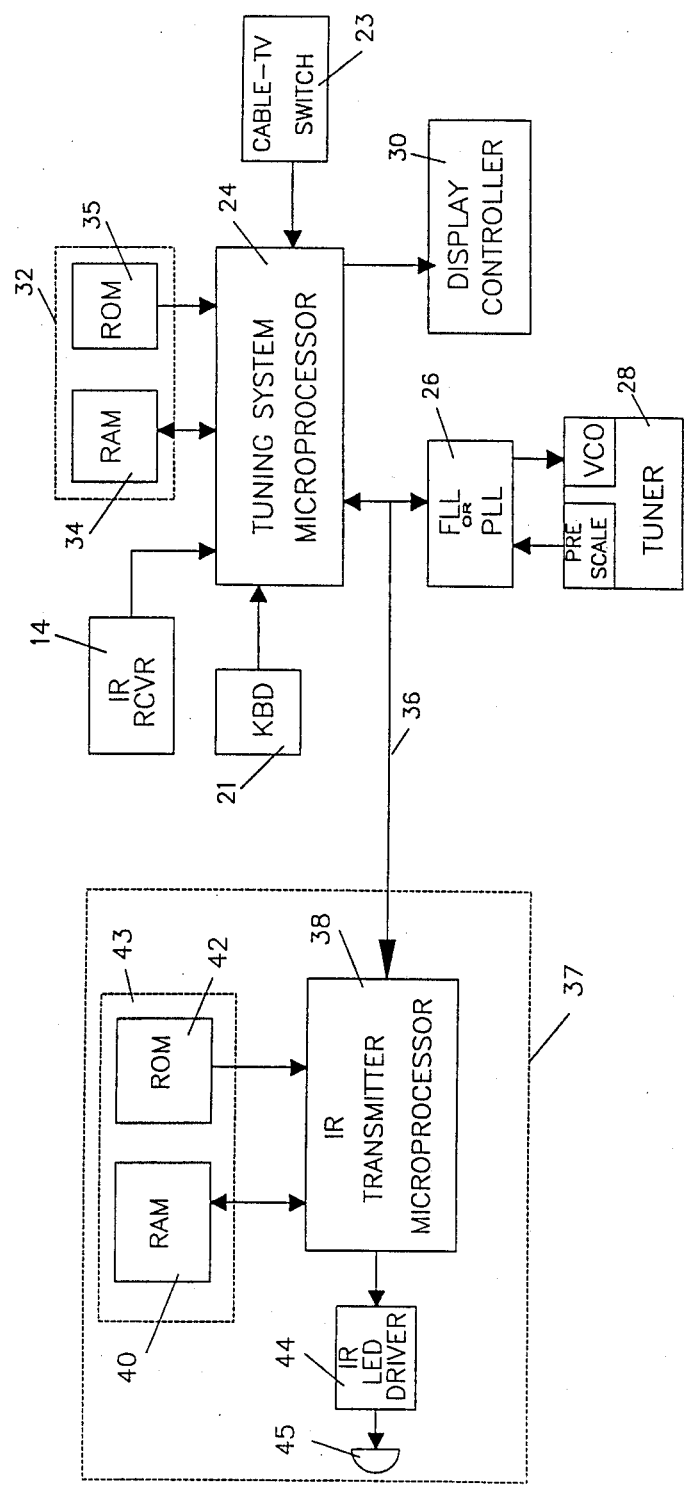
FIG. 2 is a block diagram of the system according to the present invention as interconnected to the T.V. tuning system.

The T.V. tuning system and remote control transmitter are illustrated in greater detail in the block diagram of FIG. 2. In this figure, an IR receiver 14 or a keyboard 21 furnish the desired signals to the receiver tuning system. The latter includes a microprocessor 24, a frequency or phase-locked loop 26, a tuner 28, a display controller 30, and memory 32, including a RAM 34 and a ROM 35.

The tuning system microprocessor 24 is connected via a line 36 to a remote control transmitter 37, built into the T.V. receiver. Transmitter 37 includes an infrared (IR) transmitter microprocessor 38. IR transmitter microprocessor 38 is connected to a RAM 40, a ROM 42 (together constituting a transmitter memory 43) and an IR driver 44 which in turn is connected to a light emitting diode 45, one possible means for transmitting signals from the television receiver to the cable converter or other external device in accordance with the present invention.

Figure 3:
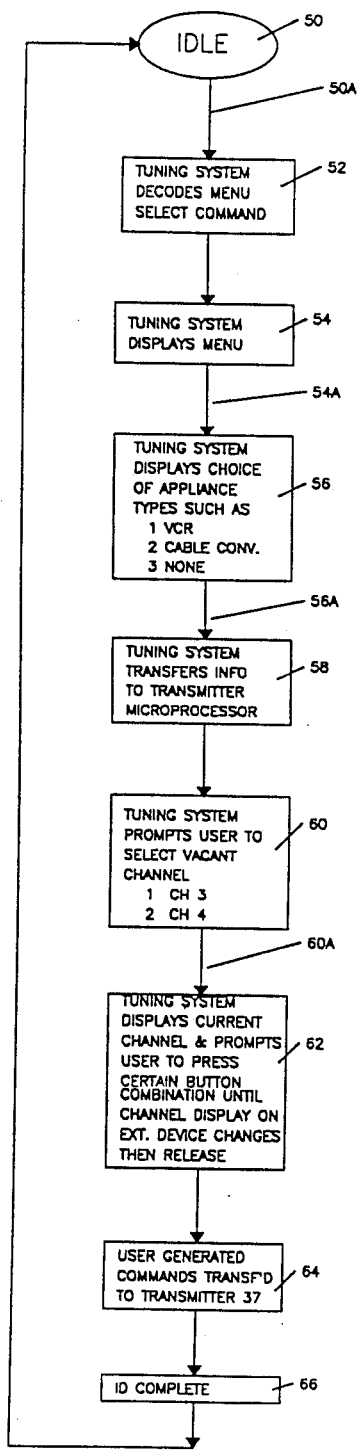
FIG. 3 is a flowchart of the identify routine according to the present invention.
Figure 4:
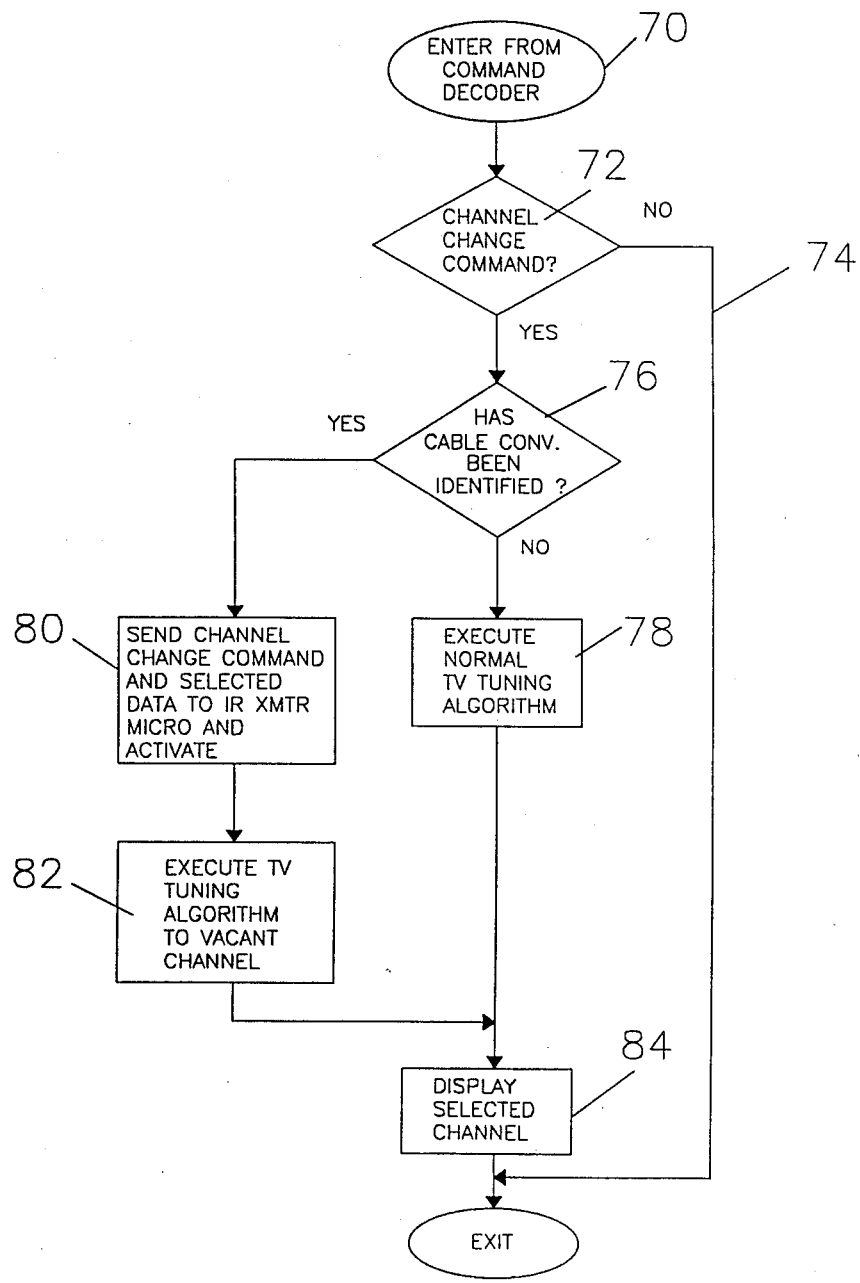
FIG. 4 is a flowchart of the channel change routine according to the present invention.

The operation of the television receiver illustrated in FIG. 2 will best be understood with reference to the microprocessor flowcharts of FIGS. 3 and 4. First, in a one time operation, if the remote control transmitter built into the television receiver is a universal type transmitter, the particular cable converter which is to be controlled by the light emitting diode (LED) 45 must be identified. In other words, remote control transmitter 37 must "learn" which particular set of codes stored in memory 43 is to be used to energize driver 44 and thus LED 45. The identify routine illustrated in FIG. 3 is a preferred embodiment of such routine. Specifically, an interactive routine, with prompts showing on the screen, is illustrated. The steps carried out by the system are indicated by numbers without letters, user interaction being signified by numbers followed by A.

Referring first to FIG. 3, the identify sub-program is normally in an idle state 50. The user then sends a command to go to menu in a step 50A. The tuning system decodes the menu select command in step 52 and displays the menu in step 54. The user then selects the "identify" function of the menu in step 54A. Thereafter, in a step 56, the tuning system displays the choice of appliance types:

1. VCR;
2. cable converter;
3. none.

These categories of course are strictly exemplary. Any external tuner may be involved for a function restorer embodiment.

From this display, the user selects the desired device in step 56A. The selected information is transferred in step 58 by the tuning system 24 to the transmitter microprocessor 38. Next, thereafter, in step 60, the user is prompted to select a vacant channel, for example channel 3 or channel 4. Again, other channels may be selected or a choice of vacant channels may be programmed into the equipment without requiring user choice. Since a choice is required in the example given, the user selects the desired empty channel in a step 60A. This information, too, is transmitted by tuning system 24 to microprocessor 38.

Step 62, the final identification of the cable converter to be controlled can take one of a number of forms. In the illustrated example, a prompt is displayed on the screen which tells the user to press a certain button or buttons until the cable converter to be controlled changes channels. When the cable converter changes channels, the user is told to release the button.

Tuning system 24 transmits the signal caused by pressing of the button or buttons directly to remote controller transmitter 37 (step 64). In response, the remote control transmitter energizes LED 45 to transmit, for example, channel up signals in different formats, associated with different manufacturers. When the correctly formatted signal is received by the cable converter, it will change channels. The user, in response, will release the button or buttons. This information is again transmitted by tuning system 24 directly to remote control transmitter 37 (step 64). The transmitter now knows that the last sent command was in the proper format. Future commands will be formatted accordingly. Release of the button or buttons completes the identify routine (step 66) and the program is returned to the idle step 50.

Once the cable converter has been identified in accordance with the above described routine, a user controlled channel change is carried out as illustrated in FIG. 4. As shown in FIG. 4, the user first selects the cable converter or other external tuning device by means of selector switch 23. Next, the user enters the number of his selected channel either by means of an external remote control transmitter 16 operating in conjunction with the IR receiver 14, or by means of the keyboard 21. The tuning command is applied to a command decoder, part of microprocessor 24. The output of the command decoder is entered as step 70 in the flowchart of FIG. 4. It is then determined, (decision 72) whether a channel change command is involved. If not, the channel change program is bypassed (74) and exits to the main program.

However, if there has been a channel change command, switch 23 is tested in step 76 to see whether a cable converter for other external tuning system has been selected. If not, the normal TV tuning algorithm is executed (step 78).

If, on the other hand, an external tuning device has been noted in step 76, the channel change command and selected channel data is transmitted to the transmitter microprocessor (step 80) and the internal remote control transmitter 37 is activated. In addition, the normal tuning algorithm for a selected empty channel (e.g. channel 3) is executed (step 82). In step 84 channel-associated functions are carried out, either in conjunction with step 80 or in conjunction with step 78. These channel associated functions include, but are not limited to, parental control and display of the selected channel on the television screen. The latter is illustrated in FIG. 4. The sub-program is exited following step 84.

In a preferred embodiment, the channel change command and the selected channel data are transmitted from the output of the universal remote control transmitter by means of a light emitting diode or diodes to an infrared receiver in the cable converter. The cable converter must then be mounted in a fixed position relative to the television receiver, the infrared light emitting diode being preferably mounted on the back of the television receiver. Alternatively, a wired connection would suffice.

Although the present invention has been illustrated in a specific embodiment, many different implementations are possible and will readily occur to one skilled in the art. It is intended that all such variations be encompassed in the invention as claimed in the following claims.

We claim:

1. In a television receiver having a channel-associated function which is automatically executed when a television tuning system in the television receiver is selectively tuned to a selected channel, a function restorer for restoring said channel-associated function which is suppressed when said television tuning system is fixedly tuned to an available channel different from said selected channel and tunning of said television receiver is controlled by external tuning means, said function restorer comprising:

means for generating an external tuner selection signal and a first selected channel signal signifying said selected channel;

means responsive to said external tuner selection signal and said first selected channel signal for tuning said television tuning system to said available channel and executing said channel-associated function; and remote control transmitter means in said television receiver and connected to said television tuning system for generating, in dependence on said channel-associated function, a second selected channel signal corresponding to said first selected channel signal and transmitting said second selected channel signal to said external turning means for tuning said external tuning means to said selected channel.

2. A function restorer as set forth in claim 1, wherein said external tuning means has receiver means for receiving said second selected channel signal; and wherein said remote control transmitter means is mounted in a line of sight with said receiver means.

3. A function restorer as set forth in claim 1, wherein said remote control transmitter means is connected by a wire connected to said external tuning means.

4. A function restorer as set forth in claim 1, wherein said remote control transmitter means includes a light emitting diode.

5. A function restorer as set forth in claim 4, wherein said light emitting diode emits infrared signals.

6. A function restorer as set forth in claim 1, wherein said remote control transmitter means comprises a universal remote control transmitter means adapted to control a plurality of different types of devices.

7. Apparatus as set forth in claim 6 wherein said plurality of different types of devices comprises VCRs and cable converters.

* * * * *